United States Patent
Staudinger et al.

(10) Patent No.: US 9,118,279 B2
(45) Date of Patent: Aug. 25, 2015

(54) POWER AMPLIFIERS WITH SIGNAL CONDITIONING

(71) Applicants: Joseph Staudinger, Gilbert, AZ (US); Ramanujam Srinidhi Embar, Chandler, AZ (US)

(72) Inventors: Joseph Staudinger, Gilbert, AZ (US); Ramanujam Srinidhi Embar, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 57 days.

(21) Appl. No.: 14/045,607

(22) Filed: Oct. 3, 2013

(65) Prior Publication Data
US 2015/0097623 A1   Apr. 9, 2015

(51) Int. Cl.
*H03F 3/68* (2006.01)
*H03F 1/02* (2006.01)

(52) U.S. Cl.
CPC ................................... *H03F 1/0288* (2013.01)

(58) Field of Classification Search
USPC ................... 330/124 R, 295, 286, 53, 84
See application file for complete search history.

(56) References Cited

U.S. PATENT DOCUMENTS

| | | | |
|---|---|---|---|
| 8,710,924 B2 * | 4/2014 | van der Zanden et al. | ........................ 330/124 R |
| 2003/0197563 A1 | 10/2003 | Nishizono | |
| 2006/0119428 A1 | 6/2006 | Lee et al. | |

FOREIGN PATENT DOCUMENTS

| | | |
|---|---|---|
| EP | 2159912 A1 | 3/2010 |
| EP | 2621085 A2 | 7/2013 |
| WO | 2006066461 A1 | 6/2006 |

OTHER PUBLICATIONS

Ramzi Darraji, Fadhel. M. Ghannouchi, Digital Doherty Amplifier With Enhanced Efficiency and Extended Range, IEEE Transactions on Microwave Theory and Techniques, vol. 59, No. 11, Nov. 2011, pp. 2898-2909.
EP Application 14187537.7, Extended European search report, dated Feb. 20, 2015.

* cited by examiner

*Primary Examiner* — Hieu Nguyen
(74) *Attorney, Agent, or Firm* — Quarles & Brady LLP

(57) ABSTRACT

A device includes an amplifier having a first path and a second path and a first variable attenuator connected to the first path. The device includes a controller coupled to the first variable attenuator. The controller is configured to determine a magnitude of an input signal to the amplifier. When the magnitude of the input signal is below a threshold, the controller is configured to set an attenuation of the first variable attenuator to a first attenuation value. When the magnitude of the input signal is above the threshold, the controller is configured to set the attenuation of the first variable attenuator to a second attenuation value. The second attenuation value is less than the first attenuation value.

20 Claims, 8 Drawing Sheets

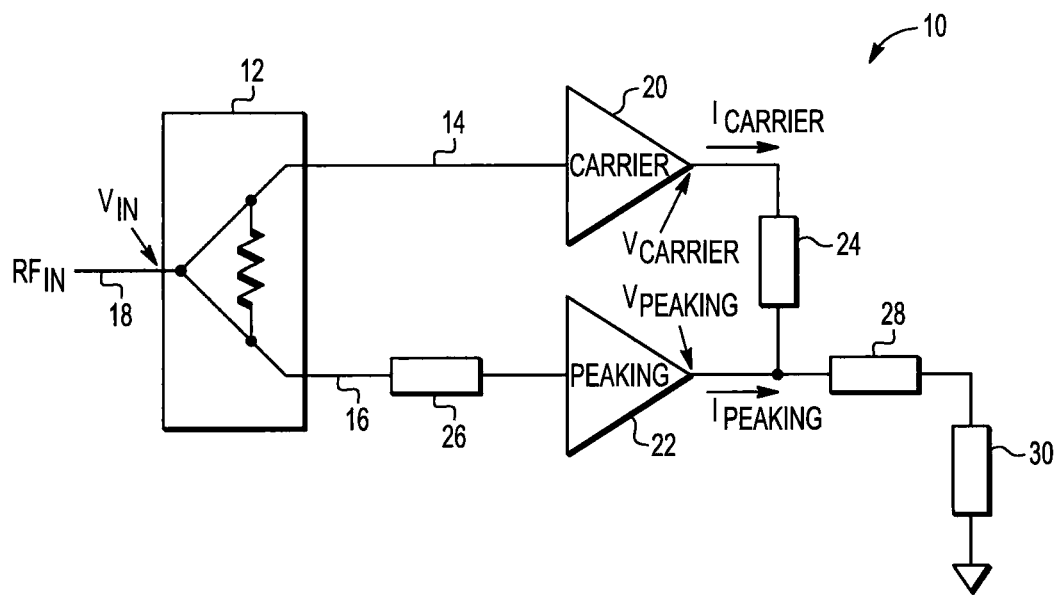
FIG. 1
- PRIOR ART -
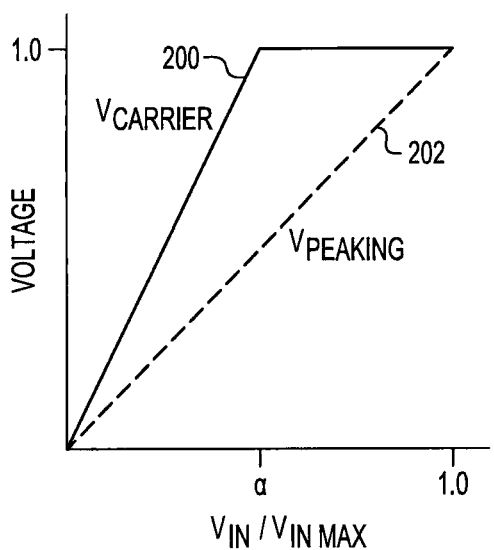 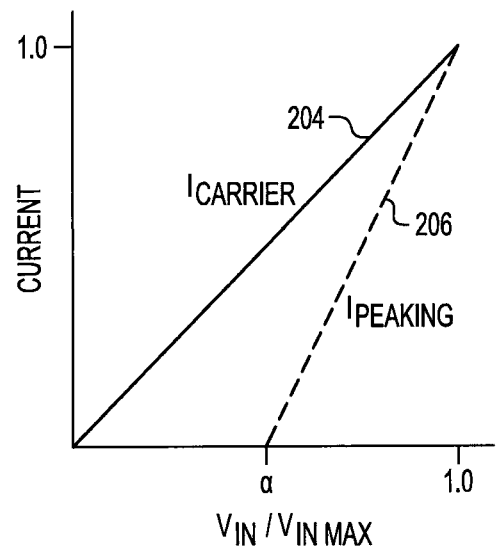
FIG. 2A          FIG. 2B

POWER AMPLIFIERS WITH SIGNAL CONDITIONING

FIELD OF THE INVENTION

Embodiments of the inventive subject matter relate to amplifiers that can have improved efficiency and more specifically to amplifiers that can have improved signal conditioning to provide improved amplifier efficiency and performance.

BACKGROUND OF THE INVENTION

Doherty amplifiers are amplifiers commonly used in wireless communication systems. Today, for example, Doherty amplifiers are used increasingly in base stations that enable the operation of wireless communications networks. Doherty amplifiers are suitable for use in such applications because the amplifiers include separate amplification paths—typically a carrier path and a peaking path. The two paths are configured to operate at different classes. More particularly, the carrier amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

Generally, a power splitter supplies the input signals to each amplification path in the Doherty amplifier. Power splitters or signal splitters or dividers are known and used, as the name suggests, to divide or split a signal into two or more signals with known, predetermined amplitude and phase relationships.

In a Doherty amplifier, it is often desirable that the amplifier exhibit high efficiency. Unfortunately, in a conventional Doherty amplifier, the manner in which the amplifiers in each path begin conducting or behave, can reduce the overall efficiency of the amplifier.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

FIG. 1 shows a conventional Doherty amplifier lineup including a main or carrier path and a peaking path.

FIGS. 2A and 2B are graphs showing an idealized operation of a conventional Doherty amplifier wherein the carrier and peaking amplifiers are modeled as ideal voltage and current sources.

DETAILED DESCRIPTION

Figure 3A:
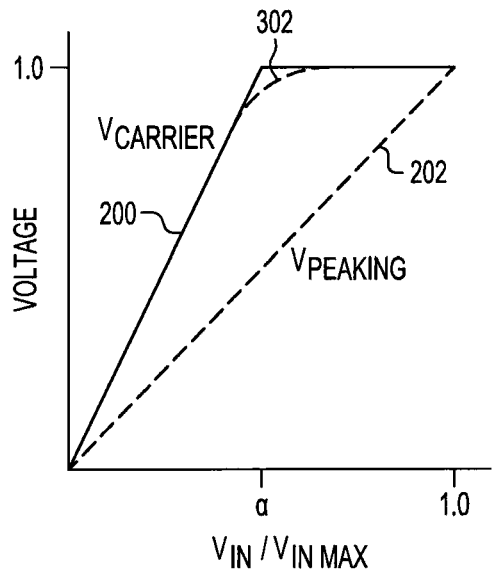
FIGS. 3A and 3B show the graphs of FIGS. 2A and 2B, respectively, modified to depict the actual operation of a Doherty amplifier.

In overview, the present disclosure describes embodiments of the inventive subject matter that relate to an amplifier that can have improved efficiency and more specifically to an amplifier that can have improved signal conditioning to provide improved amplifier efficiency and performance.

In the present disclosure, embodiments of the system are described in conjunction with a Doherty amplifier, though it should be appreciated that in the present disclosure the Doherty amplifier may be replaced by an alternative dual-path or multiple-path amplifier, in various embodiments.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers—a carrier or main amplifier, and a peaking amplifier. In a symmetric Doherty amplifier, the carrier and peaking amplifiers are the same size. Symmetric Doherty amplifiers are commonly used today, but asymmetric Doherty amplifiers that employ a peaking amplifier that is larger than the carrier amplifier offer the potential for additional efficiency improvements.

In a Doherty amplifier, an input signal is split at an input or power splitter between the main and peaking amplification paths or circuits. The split signals are then separately amplified by the main and peaking amplifiers of the Doherty amplifier and combined at an output stage. When combining the outputs of the main and peaking amplifiers, it may be desired to make minor adjustments in the phase and amplitude or attenuation of the Doherty device's input splitter to provide optimal balancing between the outputs of each path of the amplifier. To facilitate this adjustment, a Doherty amplifier may include an adjustable power divider or splitter that can be used to fine-tune the configuration of the input signals to both the main and peaking amplifiers. A Doherty amplifier may also include an adjustable phase delay and/or an amplitude adjustment configured to selectively modify the phase shift and/or amplitude one of one or more paths of the Doherty amplifier.

FIG. 1 shows a conventional Doherty amplifier lineup 10 including a main or carrier path and a peaking path. In FIG. 1 as shown, a power splitter 12 is coupled to a main or carrier path 14 and a peaking path 16 of Doherty amplifier 10. The power splitter 12 is configured to divide an input signal 18 (e.g., radio frequency in (RFIN)) into multiple signals that are each transmitted along different amplification paths. Each amplification path may include a number of attenuators, phase shifters, and/or amplifiers. In FIG. 1, the power splitter 12 generates two output signals.

In one implementation, the power splitter 12 can include a power divider with an input for receiving an input radio frequency signal, and first and second divider outputs. When connected to a symmetrical Doherty amplifier, the power splitter 12 may divide or split an input signal received at the input 18 into two signals that are very similar with, in some embodiments, equal power. In other cases, though, the power splitter 12 may output signals having unequal power.

The outputs of the power splitter 12 are connected to main or carrier amplifier 20 and peaking amplifier 22. An input of carrier amplifier 20 is coupled via a matching network or circuit (not illustrated) to a first output of power splitter 12. An input of peaking amplifier 22 is coupled via a matching network or circuit (not illustrated) to a second output of power splitter 12. As will be appreciated by those of ordinary skill based on the description herein, the carrier and peaking amplifiers 20 and 22 may be comprised of one or more stages of relatively low power level amplification and relatively high power level amplification.

An impedance inverter or a $\lambda/4$ transmission line phase shift element 24 is connected between the output of carrier amplifier 20 and a summing node, and the output of the peaking amplifier 22 also is coupled to the summing node. The phase shift introduced by element 24 is, in some implementations, compensated by a 90 degree relative phase shift present on path 16 introduced by phase shift element 26.

An impedance network, including impedance 28, functions to present the proper load impedances to each of carrier amplifier 20 and peaking amplifier 22, and combines the signals produced from each amplifier at a common output node. An output load 30 (e.g., 50 ohms) is connected to the outputs of carrier amplifier 20 and peaking amplifier 22.

Amplifier 10 is configured so that the carrier amplifier 20 provides the amplification for lower level input signals, and both amplifiers 20 and 22 operate in combination to provide the amplification for high input level signals. In one implementation, the carrier amplifier 20 is configured to amplify a signal received from the main path 14, while the peaking amplifier 22 is configured to amplify a signal received from the peaking path 16 only when the input signal to the amplifier exceeds a predetermined threshold, referred to herein as transition point $\alpha$, described below.

This may be accomplished, for example, by biasing the carrier amplifier 20, such that the carrier amplifier 20 operates in a class AB mode, and biasing the peaking amplifier 22 such that the peaking amplifier 22 operates in a class C mode.

The Doherty amplifier 10 architecture depicted in FIG. 1 is widely used in communication systems due to the architecture's capability to deliver high efficiency over an extended input signal range. The architecture can also linearize well using Digital Pre-Distortion (DPD) techniques.

FIGS. 2A and 2B are graphs showing an idealized operation of a conventional Doherty amplifier wherein the carrier and peaking amplifiers are modeled as ideal voltage and current sources. In FIG. 2A, the vertical axis represents voltages $V_{carrier}$ and $V_{peaking}$ at the output nodes of the carrier amplifier 20 and peaking amplifier 22 of FIG. 1, while the horizontal axis represents the normalized input signal voltage $V_{in}/V_{in\_max}$ (as identified in FIG. 1), where $V_{in}$ is normalized to the maximum input voltage $V_{in\_max}$. In FIG. 2B, the vertical axis represents currents $I_{peaking}$ and $I_{carrier}$ (as identified in FIG. 1), while the horizontal axis represents the normalized input voltage $V_{in}/V_{in\_max}$. Currents $I_{carrier}$ and $I_{peaking}$ are the result of sweeping the input power from zero to higher values that result in $V_{in}/V_{in\_max}$ equal to unity. In both graphs, the voltage and current values have been normalized around the value of 1.0 volt (V) or amp (A). The curves depicted in FIGS. 2A and 2B represent all possible operating points for the idealized carrier and peaking amplifiers. In FIG. 2A, line 200 shows the voltage for the carrier amplifier, while line 202 shows voltage for the peaking amplifier. In FIG. 2B, line 204 shows the current for the carrier amplifier, while line 206 shows the current for the peaking amplifier.

The operation of the Doherty amplifier depicted in FIGS. 2A and 2B is based on well known first order concepts where the carrier amplifier 20 and peaking amplifier 22 are modeled as current sources when not saturated, and voltage sources when saturated. At low input power levels below transition point $\alpha$, peaking amplifier 22 of amplifier 10 is non-conducting due to the Class-C bias of peaking amplifier 22. As such, all amplification generated by amplifier 10 below transition point $\alpha$ is achieved using only carrier amplifier 20.

With increasing input power levels, a point is reached (i.e., transition point $\alpha$ as labeled on both FIGS. 2A and 2B) where the radio frequency (RF) input signal is sufficiently large such that carrier amplifier 20 is at the onset of saturation and produces a consistent RF output voltage of 1 V (normalized)—see the horizontal portion of line 200 of FIG. 2A. When saturated, carrier amplifier 20 can be represented and modeled by first order principles as a voltage source such that with further increases in input power, $V_{carrier}$ remains at unity (normalized). Due to impedance inverters 24 and 28 (shown on FIG. 1), voltage $V_{peaking}$ is less than unity. With further increases in input power, the operation of carrier amplifier 20 and peaking amplifier 22 moves beyond the transition point α. The peaking amplifier begins to conduct and contribute current $I_{peaking}$ having the effect of modulating the impedance seen by carrier amplifier 20, which then further allows carrier amplifier 20 to contribute additional RF current. Under full drive conditions where $V_{in}/V_{in\_max}$ equals unity, both carrier amplifier 20 and peaking amplifier 22 are saturated and producing maximum power.

The value of transition point α can be determined by the desired load modulation, which is related to the power capability of the carrier and peaking amplifiers. Typically, transition point α is chosen as 1/(1+Pp/Pc), where Pp and Pc are the power capability of the peaking and carrier amplifiers, respectively. This is illustrated by the increase in current from peaking amplifier 22 depicted in line 206 of FIG. 2B above the transition point α on the horizontal axis.

In evaluating the performance of a Doherty amplifier, consideration may be made for the amplifier's operation when input power levels are near—above and below—transition point α, and the overall efficiency of the Doherty amplifier in that region. A traditional analysis of the Doherty architecture in which the carrier and peaking amplifiers are represented by ideal voltage and current sources suggests that at transition point α the efficiency of the overall Doherty amplifier is determined solely by the carrier amplifier; assuming Class-B operation for the carrier amplifier, an efficiency value of $\pi/4$ is suggested at $V_{in}/V_{in\_max}=\alpha$. This analysis assumes the peaking amplifier to be non-contributing since, in the idealized model, $I_{Peaking}$ is zero at transition point α.

In reality, the peaking amplifier is not an ideal voltage and current source. $I_{peaking}$ does not transition abruptly from zero to above zero as $V_{in}/V_{in\_max}$ transitions from below α to above a due to the Class-C operation of the peaking amplifier. In other words, the sharp corners in lines 200 and 206 at transition point α of FIGS. 2A and 2B do not accurately depict the operation of a real Doherty amplifier. In practice, the responses are more gradual for both $I_{Peaking}$ and $V_{carrier}$.

Figure 3B:
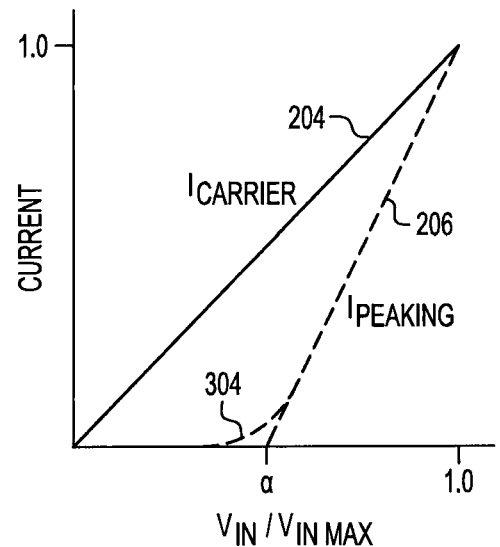

FIGS. 3A and 3B show the graphs of FIGS. 2A and 2B, respectively, with modifications to depict the actual operation of a Doherty amplifier about transition point α. As seen in FIG. 3A, about transition point α the voltage of the carrier amplifier (depicted by line 200) does not sharply transition from increasing to reaching a maximum value of 1.0 V. Instead, as shown by dashed line 302, the transition is gradual. As such, in a real amplifier, even at some power output level greater than that of transition point α, the carrier amplifier has still not reached full saturation, again, in contradiction to the idealized model.

Similarly, as seen in FIG. 3B, the current of the peaking amplifier (depicted by line 206) does not sharply transition when the peaking amplifier begins conducting near transition point α. Instead, as shown by dashed line 304, the transition is gradual. As such, in a real amplifier, even at some power output less than that of transition point α, the peaking amplifier is already conducting, in contradiction to the idealized model. This early turn-on attribute of the peaking amplifier contributes to the carrier amplifier not reaching full saturation until the input goes above transition point α (see curve 302 of FIG. 3A).

Figure 4A:
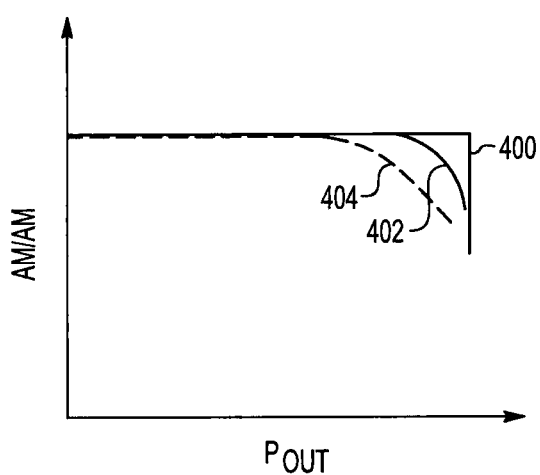
FIG. 4A is a graph illustrating a number of am/am curves for an amplifier device.

In addition to efficiency, linearity is another important attribute of an amplifier. Amplifier linearity can be expressed in terms of amplitude-to-amplitude distortion (am/am) and amplitude-to-phase distortion (am/pm). FIG. 4A is a graph illustrating a number of am/am distortion curves. The vertical axis of the graph in FIG. 4A shows am/am distortion, while the horizontal axis represents power output of an amplifier, such as amplifier 10 of FIG. 1. Line 400 is an idealized curve showing perfect linearity, while line 404 depicts a degraded am/am response of a conventional amplifier. The present disclosure provides an improved amplifier device that may have a response similar to that illustrated by line 402, which depicts an improved am/am response over the conventional device and more closely approximates that of an ideal device. It is generally desirable that the am/am distortion attributes of an amplifier fall as closely as possible to line 400 and remain constant with increasing drive input up until the point that the amplifier compresses in gain.

Figure 4B:
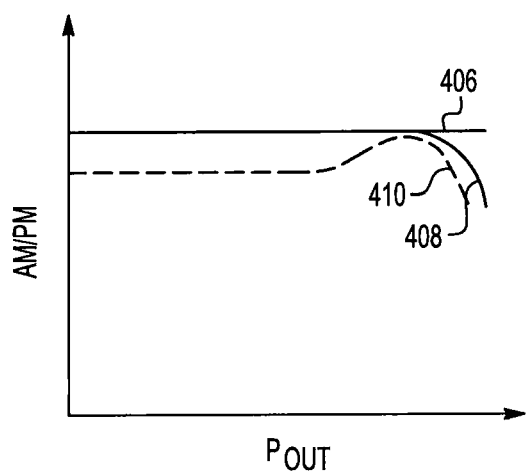
FIG. 4B is a graph illustrating a number of am/pm curves for an amplifier device.

FIG. 4B is a graph illustrating a number of am/pm curves. The vertical axis of the graph in FIG. 4B shows am/pm distortion, while the horizontal axis represents power output. Line 406 is an idealized curve showing perfect linearity, while line 410 depicts a degraded am/pm response of a conventional amplifier. The present disclosure provides an improved amplifier device that may have a response similar to that illustrated by line 408, which depicts an improved am/pm response over the conventional device and more closely approximates that of an ideal device. It is generally desirable that the am/pm distortion attributes of an amplifier fall as closely as possible to line 406 and remain constant with increasing drive input up until the point that the amplifier compresses in gain.

Accordingly, the overall efficiency and linearity of a conventional Doherty amplifier can be degraded by a number of factors. First, the manner in which the peaking amplifier begins conducting can reduce the device's efficiency, as illustrated in FIGS. 3A and 3B. Generally, it is desirable that the peaking amplifier remain in an off state and be non-conducting for signal levels below α, and turn on abruptly for signal levels above α. This behavior would then mimic the responses of the idealized carrier and peaking amplifiers illustrated in FIGS. 2A and 2B. The usual method to approximate this characteristic is to bias the peaking amplifier into a class-C mode of operation, but this still results in the less than ideal behavior depicted in FIGS. 3A and 3B.

Additionally, affecting the linearity of the amplifier, for output levels between transition point α and a maximum output, the peaking amplifier amplifies the input signal and produces a signal component that vectorally contributes to the signal generated by the carrier amplifier at the amplifier's summing node, resulting in a non-linear response. In practice, the gain response of the peaking amplifier at output levels between α and 1 is non-ideal due to the class-C bias of the peaking amplifier, and contributes substantially to lowering the overall Doherty amplifier linearity.

To mitigate these effects, some amplifier designs are configured to completely separate the carrier path and peaking path within the amplifier. In these devices, each path has its own transmitter that operates independently of the other transmitter to supply an input signal to each of the carrier and peaking amplifiers. Although this configuration enables precise control of the signal that is inputted to each of the carrier and peaking amplifiers, the additional transmitters result in considerable increases in cost, size, and power consumption of the amplifier.

In embodiments of the present system and method, variable attenuators and phase shifters are positioned at the input side of one or more of the amplifiers of a multi-path amplifier device. In a Doherty amplifier having a carrier amplifier and a peaking amplifier, for example, the variable attenuators and phase shifters may be positioned at the input of only the peaking amplifier, both the peaking amplifier and carrier amplifier, or, alternatively, at the input of only the carrier amplifier. The configuration of the variable attenuators and phase shifters can then be controlled or adjusted to shape the signal being inputted into one or more of the amplifiers. In this manner, the variable attenuators and phase shifters can be used to provide more abrupt turn-on and/or turn-off responses of the peaking amplifier about transition point α. Additionally, the input signals at the peaking amplifier and, optionally, the carrier amplifier can be controlled to result in an amplifier output that can be more linear, approximating the ideal am/am and am/pm responses illustrated in FIG. 4A and FIG. 4B.

Figure 5:
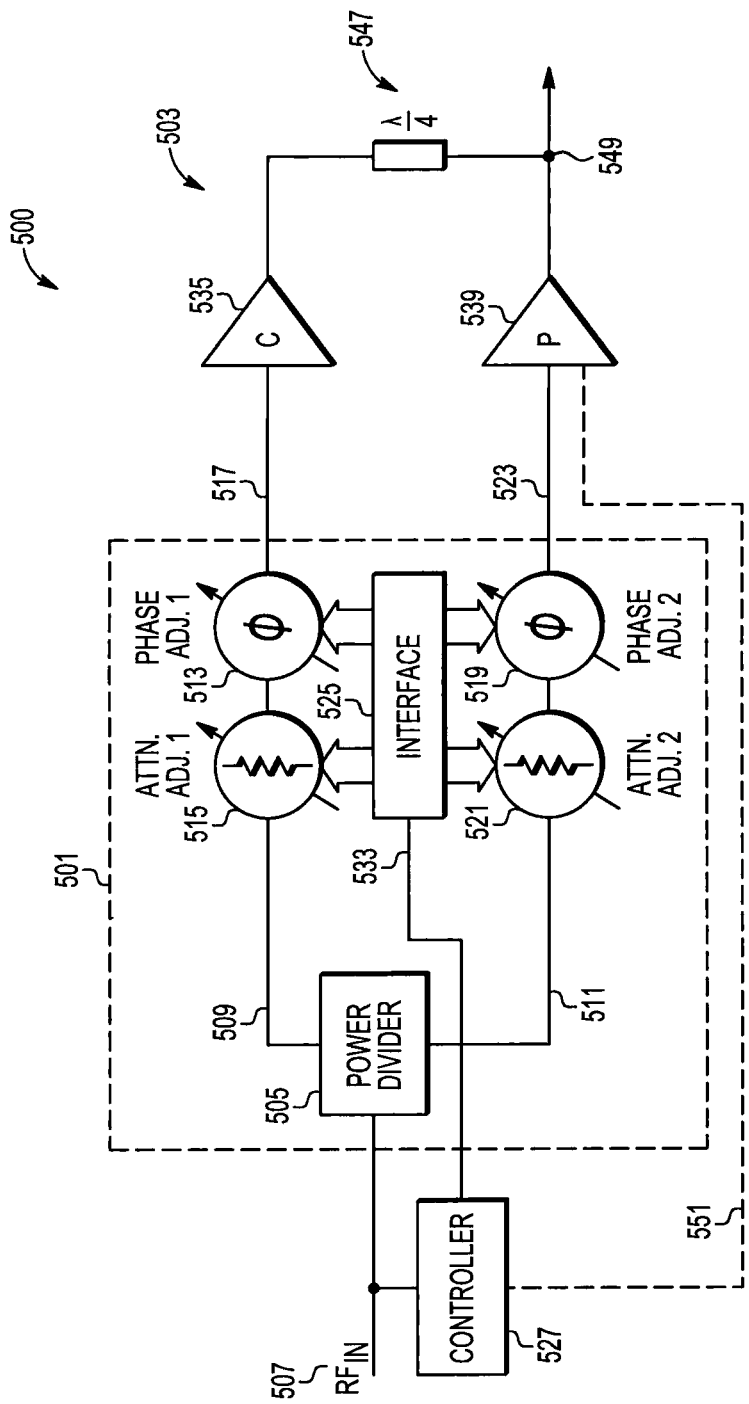
FIG. 5 shows a dual path amplifier having variable attenuators and phase shifters on each path of the amplifier.

FIG. 5, for example, depicts dual path amplifier 500 having variable attenuators and phase shifters positioned on each path of the amplifier. Amplifier 500 includes alignment module or power splitter 501. Power splitter 501 divides an input signal into multiple amplification paths, where each amplification path includes a variable attenuator (e.g., one of attenuators 515, 521), an adjustable phase shifter (e.g., one of phase shifters 513, 519), and an amplifier (e.g., one of amplifiers 535, 539).

Power splitter 501 includes a power divider 505 with an input 507 for receiving an input radio frequency signal (REIN), and first and second divider outputs 509, 511, respectively. In a symmetrical Doherty amplifier, power divider 505 operates to divide or split an input signal received at input 507 into two signals that are very similar with, in some embodiments, equal power. This equal power form of power divider may be referred to as a 3 decibel (dB) divider when the resultant signals are each 3 dB less than the signal at the input. While a 3 dB divider is typical, other dividers with multiple outputs or outputs with unequal signals could be fashioned and used in some applications, in other embodiments.

Power splitter 501 includes first adjustable phase shifter 513 and first variable attenuator 515, which are coupled to the first divider output 509 and configured for providing a first power output 517. It will be appreciated that the adjustable phase shifter and variable attenuator can be coupled to each other in any order (e.g., attenuator followed by phase shifter as shown or vice versa). Power splitter 501 includes second adjustable phase shifter 519 and second variable attenuator 521, which are coupled to the second divider output 511 and configured for providing a second power output 523. As noted above, the order in which these components are coupled to each other can be changed.

In various embodiments of the adjustable power splitter 501, the first and second adjustable phase shifters 513, 519 are each digitally controlled (e.g., using interface 525) and have a plurality of states resulting in various levels of phase shift. The first and second adjustable phase shifters 513, 519, for example, may each have eight phase shifted states where each phase shifted state defines a particular phase shift in degrees. In one example, the phase shifted states can be separated by approximately 6.5 degrees. It will be appreciated that the first and second adjustable phase shifters 513, 519 may have different phase shifted states, cover different ranges, and have different steps sizes from one another, although typically they will be essentially the same. While digitally controlled, the adjustable phase shifters in many embodiments are analog phase shifters.

In various embodiments of power splitter 501, the first and typically the second variable attenuator 515, 521 are each digitally controlled (e.g., using interface 525) and have a plurality of attenuation levels where the attenuation levels are separated by a number of decibels (dB)—in one example 0.5 dB separates the attenuation levels. The first and second variable attenuators 515, 521 may each have, for example, eight attenuation states or attenuation levels, although they may have more or fewer attenuation states or attenuation levels, in other embodiments. It will be appreciated that the first and second variable attenuators may have different attenuation states, cover different attenuation ranges, and have different attenuation steps sizes from one another, although typically they will be essentially the same. While digitally controlled, the variable attenuators in some embodiments can be analog attenuators.

Some embodiments of power splitter 501 may further include an optional fixed phase shifter that is configured for adding a fixed phase shift between first and second signals at the, respectively, first and second power outputs 517, 523. In some embodiments, this can be a fixed and predetermined phase shift (e.g., 90 degrees) added to one amplification path (e.g., the amplification path between output 509 and power output 517, or the amplification path between output 511 and power output 523).

In certain applications (e.g., within Doherty amplifier 503), a ninety degree phase shift is added to one path in the amplifier, and the fixed phase shift can be used to offset this amplifier phase shift. The fixed phase shift in some embodiments includes a phase shift in a negative or positive direction (e.g., a negative shift λ/8, such as a negative forty five degree shift) for the first signal at the first power output 517, and a phase shift in the opposite direction (e.g., a positive shift λ/8 such as a positive forty five degree phase shift) for the second signal at the second power output 523. Using the opposite-signed, forty five degree phase shifts yields a ninety degree relative phase shift between the signals at the power outputs 517, 523. The phase shifters can be implemented as lumped element circuits each having an inductive and a capacitive reactance.

Interface 525 can be configured and arranged for setting the adjustable phase shifters 513, 519 and variable attenuators 515, 521 of power splitter 501 in response to an input received at input 533. Using interface 525, controller 527 may be configured to adjust and modify power splitter 501 in accordance with the methods described in the present disclosure. Input 533 (or input/output) of interface 525 may include a data interface (e.g., a serial interface such as a serial peripheral interface (SPI), not illustrated). The data interface (e.g., the SPI) may be implemented on the same integrated circuit chip as power splitter 501 (e.g., a single silicon or gallium-arsenide chip), or the data interface and the power splitter 501 may be implemented on different integrated circuit chips (e.g., two silicon chips, two gallium-arsenide chips, or a combination of one silicon chip (e.g., for the SPI) and one gallium-arsenide chip (e.g., for the power splitter 501).

Generally, the attenuators 515, 521 and/or phase shifters 513, 519 are controlled using a number of switches, typically solid state or integrated switches such as those implemented as transistors. Thus, interface 525 can be provided state information for all switches in all attenuators 515, 521 and phase shifters 513, 519, and the interface 525 acts as one or more latching buffers with outputs arranged and coupled to ensure that all switches are in the appropriate ON or OFF state. Alternatively, interface 525 can be provided an encoded value (e.g., a binary value) or two or more encoded values, wherein each of the encoded values uniquely specify a state for each attenuator 515, 521 and phase shifter 513, 519. For example, if all phase shifters 513, 519 and attenuators 515, 521 are 8 state devices, a 3 bit encoded value for each could be used to uniquely specify a particular state. Accordingly, during operation, 4 such encoded values could be provided to interface 525 (e.g., one for each attenuator 515, 521, and one for each phase shifter 513, 519). Interface 525 may then convert each encoded value to the appropriate control signals (e.g., switch control signals) for each attenuator 515, 521 and phase shifter 513, 519, and latch in these values. In other embodiments, the amount of phase shift and attenuation for each of the four devices 513, 515, 519, 521 could be sent to interface 525, and the interface 525 could determine the proper state to realize the desired shifts and attenuations. In another alternate embodiment, the interface 525 may receive an address or offset, and may look up the phase state and/or attenuator state information in a lookup table (not illustrated) based on the received address or offset.

Controller 527 is coupled to RFIN 507 and is configured to analyze an input signal supplied to amplifier 500. As described below, by analyzing that input signal, and, specifically, a magnitude of that signal, controller 527 can be configured to manipulate one or more of variable attenuators 515, 521 and phase shifters 513, 519 using interface 525 to improve the efficiency and linearity of amplifier 500.

Doherty amplifier 503 of amplifier 500 includes main or carrier amplifier 535 coupled via a matching network or circuit (not illustrated) to the first power output 517 and a peaking amplifier 539 coupled via a matching network or circuit (not illustrated) to the second power output 523. As will be appreciated by those of ordinary skill based on the description herein, the main and peaking amplifiers 535, 539 may be comprised of one or more stages of relatively low power level amplification and relatively high power level amplification. In an alternate embodiment, device 500 may have an "inverted Doherty" configuration. In such a configuration, the impedance inverter or $\lambda/4$ line phase shift element 547 is connected between the output of peaking amplifier 539 and the summing node, rather than being connected between the output of carrier amplifier 535 and the summing node.

The carrier and peaking amplifiers 535, 539 are coupled via respective output matching circuits (not illustrated) to a Doherty combiner 547, and output node 549. Doherty combiner 547 is configured such that the carrier amplifier 535 provides the amplification for lower level signals, and both amplifiers 535, 539 operate in combination to provide the amplification for high level signals wherein the input signal exceeds transition point $\alpha$. This may be accomplished, for example, by biasing the carrier amplifier 535, such that it operates in a class AB mode, and biasing the peaking amplifier 539 such that it operates in a class C mode.

More complex implementations of amplifier 500 are possible in which power splitter 501 has three outputs, and the Doherty amplifier 503 has a main and two peaking amplifiers, for example, with each peaking amplifier biased in different class C operating points. In such an embodiment, the power splitter 501 may include three amplification paths (each including an adjustable phase shifter and a variable attenuator).

In embodiments of the present system, the variable attenuators 515, 521 and phase shifters 513, 519 are manipulated by controller 527 to shape the signal being inputted into one or more of the amplifiers (e.g., carrier amplifier 535 and peaking amplifier 539) to provide a more abrupt turn-on and/or turn-off response of the peaking amplifier about transition point $\alpha$. Additionally, the input signals at the peaking amplifier 539 and, optionally, the carrier amplifier 535 can be controlled to more closely approximate the ideal am/am and am/pm responses illustrated in FIG. 4A and FIG. 4B.

Referring to FIG. 5, in a first implementation of the present system only variable attenuator 521 and phase shifter 519 are manipulated so as to shape the input signal to peaking amplifier 539. In such an implementation, variable attenuator 515 and phase shifter 513 are optional and may be removed from the circuit so that nodes 509 and 517 are directly connected to one another. Generally, however, variable attenuators 515 and 521 as well as phase shifters 513 and 519 are each present within the amplifier and used in conjunction to shape the signals being inputted to both the carrier amplifier 535 and the peaking amplifier 539 to provide for optimum performance.

Controller 527 is configured to modify the states of both variable attenuator 521 and phase shifter 519 to modify the turn-on characteristics of peaking amplifier 539 about transition point $\alpha$ and consequently to modify the output of peaking amplifier 539 to more closely approximate the ideal am/am and am/pm response of amplifier 500.

Controller 527 is configured to monitor the input signal RFIN and modify the attenuation of variable attenuator 521 based upon the magnitude of the envelope voltage of the input signal, which can vary over time. In other cases, the attenuation may be varied based upon the peak envelope voltage, the average envelope voltage, the peak envelope power, the average envelope power, or some other power or voltage measurement with respect to the input signal. When the magnitude of the envelope input signal is below transition point $\alpha$, the attenuation of variable attenuator 521 is set to a maximum value. This reduces the RF voltage present at the input to peaking amplifier 539, forcing the amplifier into a non-conductive state preventing peaking amplifier 539 from operating when the input signal is below transition point $\alpha$. Conversely, when the magnitude of the input signal exceeds that of transition point $\alpha$, the attenuation of variable attenuator 521 is set to a minimum value enabling peaking amplifier 539 to conduct and operate normally. Generally, the maximum attenuation value of variable attenuator 521 depends on the available attenuation range of variable attenuator 501, as set forth by the attenuator's design. The maximum attenuation for a given variable attenuator 521 design may be 100% attenuation. Conversely, the minimum attenuation value can be an attenuation value below the attenuator's maximum attenuation.

By forcing peaking amplifier 539 into a non-conducting condition below transition point $\alpha$ (by setting the attenuation of variable attenuator 521 to a maximum value), and into a conducting condition above transition point $\alpha$ (by setting the attenuation of variable attenuator 521 to a minimum value), carrier amplifier 535 is allowed to approach its saturation voltage as the input signal increases and approaches transition point $\alpha$ without interference from peaking amplifier 539, resulting in higher Doherty efficiency at transition point $\alpha$. Conversely, as the input signal levels grow greater than transition point $\alpha$, at which point carrier amplifier 535 is saturated, peaking amplifier 539 is allowed to begin operating. At input signal magnitudes between transition point $\alpha$ and a maximum, variable attenuator 521 may exhibit several attenuation states. Near the value of transition point $\alpha$, variable attenuator 521 is controlled to achieve a sharp transition in voltage and current in peaking amplifier 539. At input signal magnitudes significantly above alpha (but less than a maximum), variable attenuator 521 and phase shifter 519 may be further adjusted to improve the am/am response of the amplifier.

When manipulating the attenuation of variable attenuator 521 between minimum and maximum attenuation values, controller 527 does not transition variable attenuator 521 directly from the minimum attenuation state to the maximum attenuation state, and vice versa, in an embodiment. Instead, the controller 527 causes the attenuation of variable attenuator 521 to pass through a number of intermediate attenuation levels over a relatively small range of input signal voltages. This transition process (as illustrated in further detail in FIG.

6A), enables a smooth, but relatively abrupt turn-on of peaking amplifier 539. In an alternate embodiment, variable attenuator 521 may be adjusted rapidly between minimum and maximum attenuation states (e.g., in one step or in very few steps). However, if variable attenuator 521 were to change states too quickly between minimum and maximum attenuation states (e.g., by transitioning directly from maximum attenuation to minimum attenuation), such a change in attenuation could introduce transient signals into the signal path of the Doherty amplifier.

Figure 6A:
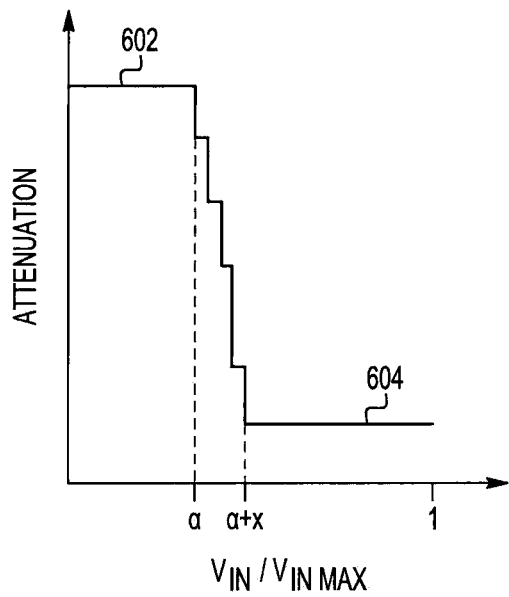
FIG. 6A is a graph illustrating how the attenuation of a variable attenuator may be set based upon a magnitude of the input signal RFIN.

FIG. 6A is a graph illustrating how the attenuation of variable attenuator 521 may be set by controller 527 based upon a magnitude of the input signal RFIN. In FIG. 6A, the vertical axis represents the attenuation of variable attenuator 521 in dB, while the horizontal axis represents the normalized input voltage to amplifier 500 ($V_{in}/V_{in\_max}$). It should be noted that the horizontal axis in FIG. 6A is not to scale and points on the horizontal axis are representative of particular values.

For input voltage values below transition point α, the attenuation is set to a maximum value 602. As the input voltage exceeds transition point α, however, the attenuation of variable attenuator 521 is reduced. This reduction may be achieved, for example, by transitioning variable attenuator 521 through a number of attenuation states or values that fall between a maximum attenuation value 602 and a minimum attenuation value 604. The transition occurs over a small, but non-zero, range of input voltages. In one implementation the transition occurs between transition point α and a point α+X, where X is between about 1% and about 10% of $V_{in\_max}$. When transitioning the attenuation of variable attenuator 521 between maximum and minimum values, the controller 527 and interface 525 are configured to change state of variable attenuator 521 at a rate that is equal to or greater than the envelope rate of the input signal RFIN.

As the input voltage exceeds α+X, the attenuation of variable attenuator 521 is set to a minimum value 604. In some implementations, though, for input signal magnitudes above α+X, the attenuation of variable attenuator 521 is varied to improve the am/am response.

Accordingly, during operation, controller 527 continuously monitors the magnitude of the envelope of input signal RFIN to amplifier 500. Based upon the magnitude of the envelope of the input signal, controller 527 then determines an appropriate attenuation level of variable attenuator 521. This may be performed, for example, using a look up table that maps a particular input signal envelope magnitude to a particular attenuation state or level. In some cases, wherein variable attenuator 521 is analog, variable attenuator 521 may have a very large number of potential attenuation states. In that case, rather than transition variable attenuator 521 through a number of intermediate attenuation states, the attenuation of variable attenuator 521 may be adjusted continuously through a range of attenuation values. In that case, the series of steps in attenuation value depicted in FIG. 6A may be replaced by a straight line or a continuous curve between maximum attenuation value 602 and minimum attenuation value 604.

Once an appropriate attenuation level is identified, controller 527 communicates with interface 525 to set variable attenuator 521 to that particular attenuation level. To ensure that the attenuation level of variable attenuator 521 is set in a timely fashion, both controller 527 and interface 525 are configured to adjust the attenuation of variable attenuator 521 at a rate that is generally faster than the input signal envelope rate, such as, in one implementation, an adjustment rate that is ten times faster than the input signal envelope rate.

Figure 6B:
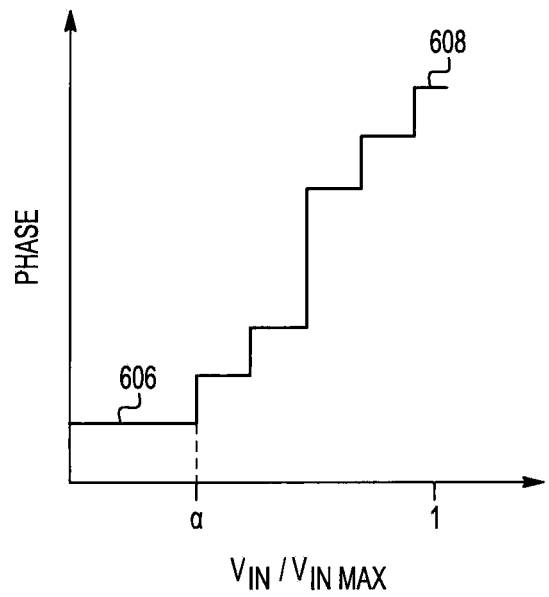
FIG. 6B is a graph illustrating how the phase shift of a phase shifter may be set based upon a magnitude of the input signal RFIN.

Similarly, while the attenuation of variable attenuator 521 can be modified to improve the performance of amplifier 500, the phase shift of phase shifter 519 can be modified based upon the input signal to improve the linearity of amplifier 500. FIG. 6B is a graph illustrating how the phase shift of phase shifter 519 may be set based upon a magnitude of the envelope of the input signal RFIN. In FIG. 6B, the vertical axis represents the phase shift of phase shifter 519, while the horizontal axis represents the normalized input voltage to amplifier 500 ($V_{in}/V_{in\_max}$). It should be noted that the horizontal axis in FIG. 6A is not to scale and points on the horizontal axis are representative of particular values.

For input voltage values below transition point α, the phase shift of phase shifter 519 can be set to a minimum value 606 (e.g., 0 degrees). As the input voltage exceeds transition point transition point α, however, the phase shift of phase shifter 519 is increased until the phase shift reaches a maximum value 608 when the input signal is at a maximum value (i.e., $V_{in}/V_{in\_max}=1$). The maximum phase shift value is selected to provide a desired output of the amplifier. In some cases, this may be approximately 45 degrees, but may vary based upon the device and may be significantly larger. This increase may be achieved, for example, by transitioning phase shifter 519 through a number of phase shift states that fall between a minimum phase shift value 606 and a maximum phase shift value 608. In some cases, wherein phase shifter 519 is analog, phase shifter 519 may have a very large number of potential phase shift states. In that case, rather than transition phase shifter 519 through a number of intermediate phase shift values, the phase shift of phase shifter 519 may be adjusted continuously through a range of phase shift values. In that case, the series of steps in phase shift values depicted in FIG. 6B may be replaced by a straight line or a continuous curve. The rate at which the phase shift of phase shifter 519 increases (thereby introducing phase shift into the path of peaking amplifier 539) can be selected, for example, to compensate for phase distortion (am/pm shift) in the peaking amplifier 539 that results when the output power of peaking amplifier 539 increases.

Accordingly, during operation, controller 527 continuously monitors the magnitude of the envelope of input signal RFIN to amplifier 500. Based upon the magnitude of the envelope of the input signal, controller 527 then determines an appropriate phase shift of phase shifter 519. This may be performed, for example, using a look up table that maps a particular input signal envelope magnitude to a particular phase shift. Once an appropriate phase shift is identified, controller 527 communicates with interface 525 to set phase shifter 519 to that particular phase shift. To ensure that the phase shift of phase shifter 519 is set in a timely fashion, both controller 527 and interface 525 are configured to adjust the phase shift of phase shifter 519 at a rate that is generally faster than the input signal envelope rate, such as, in one implementation, an adjustment rate that is ten times faster than the input signal envelope rate.

In some implementations, in addition to modifying the attenuation and phase shift of the signal being inputted into peaking amplifier 539, controller 527 may also, in combination with interface 525, modify the attenuation and phase shift of the signal being inputted to carrier amplifier 535. This may be performed, for example, by manipulating variable attenuator 515 and phase shifter 513 in a similar manner as variable attenuator 521 and phase shifter 519 are modified pursuant to the methods described above.

Figure 7A:
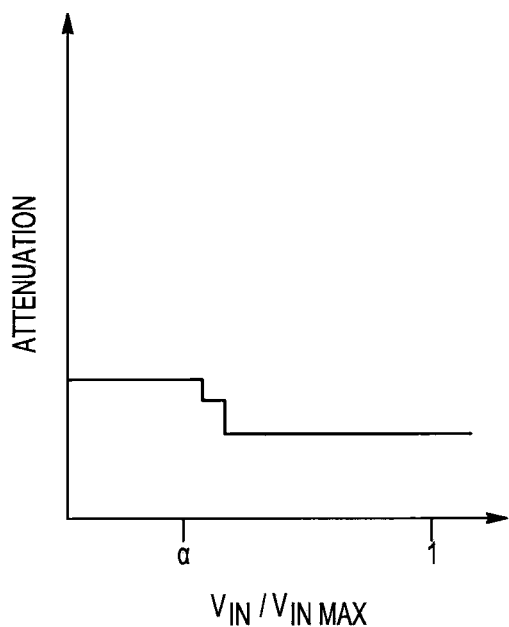
FIG. 7A is a graph illustrating how the attenuation of a second variable attenuator may be set based upon a magnitude of the input signal RFIN.

For example, FIG. 7A is a graph illustrating how the attenuation of variable attenuator 515 may be set based upon a magnitude of the envelope of input signal RFIN. In FIG. 7A, the vertical axis represents the attenuation of variable attenuator 515 in dB, while the horizontal axis represents the normalized input voltage to amplifier 500 ($V_{in}/V_{in\_max}$). It should be noted that the horizontal axis in FIG. 7A is not to scale and points on the horizontal axis are representative of particular values.

The attenuation state mapping depicted in FIG. 7A can be selected to provide for a constant gain at the output of amplifier 500. Because the output of peaking amplifier 539 can affect the operation of carrier amplifier 535, when peaking amplifier 539 begins conducting (at transition point α), the attenuation of variable attenuator 515 can be reduced in order to compensate for the gain expansion-compression behavior typically seen in class-AB gain curves—as a result of attenuating carrier path for signal levels below transition point α, improved gain response may be possible. In other implementations, however, it is possible that the attenuation characteristics of variable attenuator 515 may be reversed, with minimum attenuation below transition point α, and increased attenuation for values above transition point α. In generally, variable attenuator 515 is adjusted as a function of Vin/Vinmax to compensate for the characteristics of carrier amplifier 535 thereby improving the linearity of the overall amplifier 500 in terms of providing constant am/am distortion. Note also, that the am/am and am/pm characteristics of the carrier amplifier 535 can vary widely depending on technology and other design constraints of the amplifier, and therefore the functional relationships shown in FIGS. 7A and 7B may also vary depending upon the operation of amplifier 500.

Accordingly, during operation, controller 527 continuously monitors the magnitude of the envelope of input signal RFIN to amplifier 500. Based upon the magnitude of the envelope of the input signal, controller 527 then determines an appropriate attenuation level of variable attenuator 515. This may be performed, for example, using a look up table that maps a particular input signal envelope magnitude to a particular attenuation level.

Once an appropriate attenuation level is identified, controller 527 communicates with interface 525 to set variable attenuator 515 to that particular attenuation level. To ensure that the attenuation level of variable attenuator 515 is set in a timely fashion, both controller 527 and interface 525 are configured to adjust the attenuation of variable attenuator 515 at a rate that is equal to or faster than the input signal envelope rate.

Figure 7B:
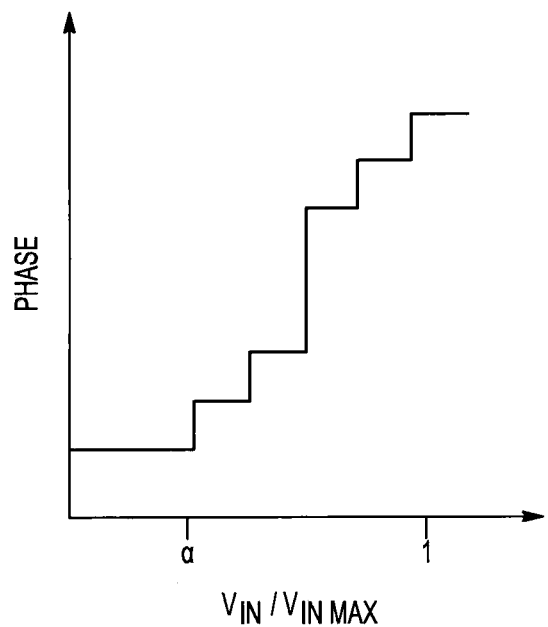
FIG. 7B is a graph illustrating how the phase shift of a second phase shifter may be set based upon a magnitude of the input signal RFIN.

Similarly, while the attenuation of variable attenuator 515 can be modified to improve the performance of amplifier 500, the phase shift of phase shifter 513 can be modified based upon the input signal to improve the linearity of amplifier 500. FIG. 7B is a graph illustrating how the phase shift of phase shifter 513 may be set based upon a magnitude of the envelope of the input signal RFIN. In FIG. 7B, the vertical axis represents the phase shift of phase shifter 513, while the horizontal axis represents the normalized input voltage to amplifier 500 ($V_{in}/V_{in\_max}$). It should be noted that the horizontal axis in FIG. 7A is not to scale and points on the horizontal axis are representative of particular values.

For input voltage values below transition point α, the phase shift of phase shifter 513 is set to a minimum value. As the input voltage exceeds transition point transition point α, however, the phase shift of phase shifter 513 is increased until the phase shift reaches a maximum value when the input signal is at a maximum value (i.e., $V_{in}/V_{in\_max}=1$). This increase may be achieved, for example, by transitioning phase shifter 513 through a number of phase shift states that fall between a minimum phase shift value and a maximum phase shift value. In some cases, wherein phase shifter 513 is analog, phase shifter 513 may have a very large number of potential phase shift states. In that case, rather than transition phase shifter 513 through a number of intermediate phase shift states, the phase shift of phase shifter 513 may be adjusted continuously through a range of phase shift values. In that case, the series of steps in phase shift values depicted in FIG. 7B may be replaced by a straight line or a continuous curve. The rate at which the phase shift of phase shifter 513 increases (thereby introducing phase shift into the path of carrier amplifier 535) can be selected, for example, to compensate for phase distortion (am/pm shift) in the carrier amplifier 535 that results when the output power of peaking amplifier 539 increases. In various amplifier implementations, the phase shift illustrated in FIG. 7B may have different shapes. For example, the phase shift may instead be the opposite of that shown in FIG. 7B—that is, a decreasing phase shift as the input signal magnitude increases.

Accordingly, during operation, controller 527 continuously monitors the magnitude of the envelope of input signal RFIN to amplifier 500. Based upon the magnitude of the envelope of the input signal, controller 527 then determines an appropriate phase shift of phase shifter 513. This may be performed, for example, using a look up table that maps a particular input signal envelope magnitude to a particular phase shift. Once an appropriate phase shift is identified, controller 527 communicates with interface 525 to set phase shifter 513 to that particular phase shift. To ensure that the phase shift of phase shifter 513 is set in a timely fashion, both controller 527 and interface 525 are configured to adjust the phase shift of phase shifter 513 at a rate that is generally faster than the input signal envelope rate, such as, in one implementation, an adjustment rate that is ten times faster than the input signal envelope rate.

Figure 8A:
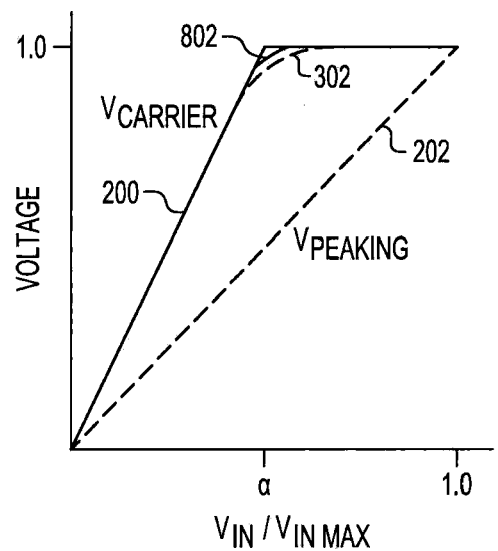
FIGS. 8A and 8B are graphs depicting the operation of an idealized Doherty amplifier, a conventional Doherty amplifier, and a Doherty amplifier including variable attenuators and phase shifters manipulated by a controller as discussed herein.
Figure 8B:
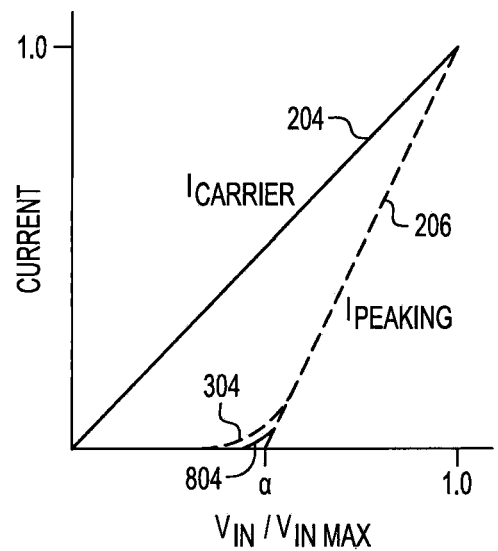

By manipulating variable attenuator 521 and phase shifter 519 and, optionally, variable attenuator 515 and phase shifter 513, as discussed above, it is possible to improve the turn-on characteristics of peaking amplifier 539, as well as improve the overall linearity of amplifier 500. To illustrate, FIGS. 8A and 8B are graphs depicting the operation of an idealized Doherty amplifier, a conventional Doherty amplifier, and Doherty amplifier 500 including variable attenuators and phase shifters manipulated by a controller as discussed above. Each graph shows data for the carrier amplifier and peaking amplifier of the Doherty amplifier. In FIG. 8A, line 200 shows the voltage for the carrier amplifier, while line 202 shows voltage for the peaking amplifier. In FIG. 8B, line 204 shows the current for the carrier amplifier, while line 206 shows the current for the peaking amplifier. In both graphs, the voltage and current values have been normalized around the value of 1.0. As in FIGS. 3A and 3B, dashed lines 302 and 304 represent the actual voltage and current curves of a conventional Doherty amplifier about transition point α. Curves 802 and 804 represent the voltage and current curves about transition point α of the Doherty amplifier of FIG. 5.

As seen in FIG. 8A, in the present amplifier the carrier amplifier reaches saturation voltage at a reduced output beyond transition point α as compared to a conventional device (see line 802). Similarly, with regards to FIG. 8B the peaking amplifier begins conducting at a greater input power level as compared to a conventional device (see line 804). These two attributes of the Doherty amplifier 500 may realize a more ideal and more efficient Doherty power amplifier by enhancing the effective turn-on characteristics of the peaking amplifier.

In an implementation of the present system, with reference to FIG. 5, controller 527 may, optionally, connect to a gate bias modulation input on peaking amplifier 539, as indicated by connection 551. By supplying a particular input voltage to the gate bias modulation input of peaking amplifier 539, controller 527 can control the gate voltage of the amplifier ($V_{G\_peaking}$) and, thereby, the direct-current (DC) operating point of the amplifier.

During operation, controller 527 continuously monitors the magnitude of the envelope of input signal RFIN to amplifier 500. Based upon the magnitude of the envelope of the input signal, controller 527 then determines an appropriate mode of operation of peaking amplifier 539.

When the input signal envelope level falls below transition point α, controller 527 supplies a signal to the gate bias modulation input to cause peaking amplifier 539 to operate as a class C amplifier and be non-conducting. This may improve the efficiency of the amplifier 500 for low-power input signals.

However, when the magnitude of the envelope of the input signal begins to exceed transition point α, controller 527 supplies a signal to the gate bias modulation input to cause peaking amplifier 539 to operate as a class AB amplifier. This causes peaking amplifier 539 to begin conducting and may provide the additional benefit of improved linearizability due to peaking amplifier 539 operating as a class AB device. In general, the quiescent bias point of the peaking amplifier 539 will be proportional to the magnitude of the envelope of the input signal. For input signal envelope magnitudes below transition point α, the peaking amplifier quiescent point will change from deep class-C to a class AB operation. Generally, the quiescent point of peaking amplifier 539 is varied at a rate that is similar to that of the input signal modulation.

Again, in an embodiment, controller 527 does not transition peaking amplifier 539 from operation as a class C device to a class AB device, and vice versa, in an abrupt manner. Instead, the transition may be gradual over a range of input signal envelope magnitudes around transition point α. An abrupt switching of the bias of the peaking amplifier from class-C to class-AB (and vice versa) may result in an abrupt change in the gain (AM/AM) and phase (AM/PM) response of the peaking amplifier in the form of glitch, which may, in turn, hinder the linearizability of the overall amplifier. On the other hand, a gradual transition of the bias of the peaking amplifier from class-C to class-AB may result in a smoother gain and phase response, thereby enabling improved linearizability of the amplifier. However, in an alternate embodiment, the bias of the peaking amplifier from class-C to class-AB may be made abruptly, regardless of linearity issues.

Figure 9:
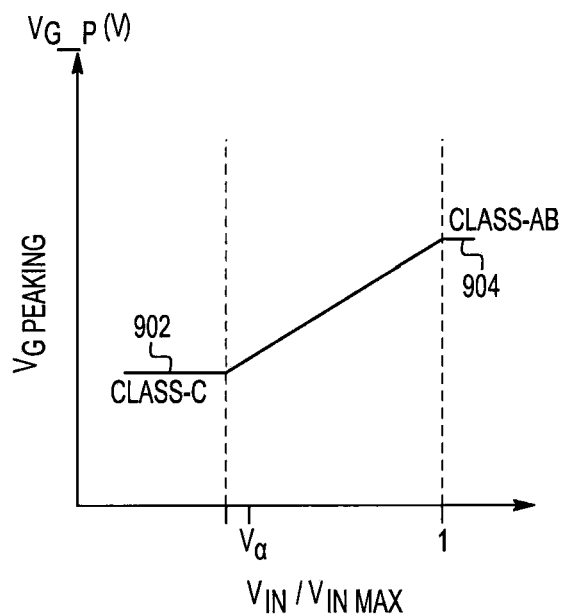
FIG. 9 is a graph illustrating how an input to a gate bias modulation input of a peaking amplifier can be set based upon a magnitude of an input signal to the amplifier.

FIG. 9 is a graph illustrating how the input to the gate bias modulation input of peaking amplifier 539 may be set based upon a magnitude of an envelope of an input signal to the amplifier. In FIG. 9, the vertical axis represents the voltage of the gate bias modulation input ($V_{G\_peaking}$), while the horizontal axis represents the normalized input voltage to amplifier 500 ($V_{in}/V_{in\_max}$). It should be noted that the horizontal axis in FIG. 9 is not to scale and points on the horizontal axis are representative of particular values.

For input voltage values below transition point α, $V_{G\_peaking}$ is set to cause peaking amplifier 539 to operate as a class C device. As the input voltage exceeds transition point α, however, $V_{G\_peaking}$ is increased, causing peaking amplifier 539 to begin transitioning into operation as a class AB device. This increase may be achieved, for example, by transitioning $V_{G\_peaking}$ through a number of distinct values that fall between a minimum $V_{G\_peaking}$ value 902 and a maximum $V_{G\_peaking}$ value 904. The transition occurs over a range of input signal magnitudes from, in one implementation, just below transition point α up to the maximum input signal magnitude. Because, at low powers of operation, peaking amplifier 539 is biased in a class-C mode of operation and the gate voltage is below the minimum voltage required to turn-on peaking amplifier 539, even though $V_{G\_peaking}$ may begin ramping up before transition point α, peaking amplifier 539 will not transition into a class-AB mode of operation until $V_{G\_peaking}$ exceeds the peaking amplifier's threshold voltage. When transitioning the value of $V_{G\_peaking}$ between minimum and maximum values, the controller 527 is configured to change $V_{G\_peaking}$ at a rate that equal to or greater than the envelope rate of the input signal RFIN. As the input voltage exceeds transition point α, $V_{G\_peaking}$ is set to maximum value 904 causing peaking amplifier 539 to operate as a class AB device.

Accordingly, during operation, controller 527 continuously monitors the magnitude of the envelope of input signal RFIN to amplifier 500. Based upon the magnitude of the envelope of the input signal, controller 527 then determines an appropriate $V_{G\_peaking}$ signal. This may be performed, for example, using a look up table that maps a particular input signal envelope magnitude to a particular attenuation state. To ensure that the gate bias modulation input of peaking amplifier 539 is set in a timely fashion, controller 527 is configured to adjust $V_{G\_peaking}$ at a rate that is equal to or faster than the signal envelope rate.

In this implementation, because, when conducting, peaking amplifier 539 is operating in a class AB mode, the amplifier may exhibit improved linearizability. As a consequence, to the biasing modification technique described above may be used in lieu of the technique of modifying phase shifters 513 and 519, as discussed above, to offset non-linearities that would have be injected into the output of amplifier 500 due to peaking amplifier 539 operating as a class C device.

Figure 10:
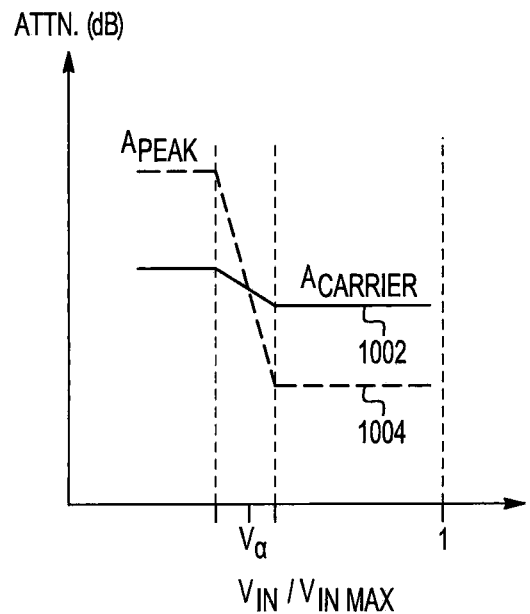
FIG. 10 is a graph illustrating an approach for modifying an attenuation of variable attenuators in combination with the gate bias modulation illustrated in FIG. 9.

Even so, the efficiency of the device may still be improved by optionally modifying the attenuation of variable attenuators 515 and 521. FIG. 10, for example, is a graph illustrating an approach for modifying the attenuation of variable attenuators 515 and 521 in combination with the gate bias modulation illustrated in FIG. 9. In FIG. 10, the vertical axis represents attenuation, while the horizontal axis represents the normalized input voltage to amplifier 500 ($V_{in}/V_{in\_max}$). Below transition point α, the attenuation of variable attenuator 515 (represented by line 1002) is set to a relatively low value enabling the carrier amplifier 535 to conduct. Conversely, the attenuation of variable attenuator 521 (represented by line 1004) is set to a relatively high value, forcing peaking amplifier 539 into a non-conductive state. Above transition point α, the attenuations of variable attenuators 515 and 521 are reversed enabling peaking amplifier 539 to be conductive. About transition point α, both variable attenuator 515 and 521 are transitioned smoothly between maximum and minimum attenuation values. The range of input voltage over which the transition may occur can be between about 1% and 10% of $V_{in\_max}$, in one example.

Figure 11A:
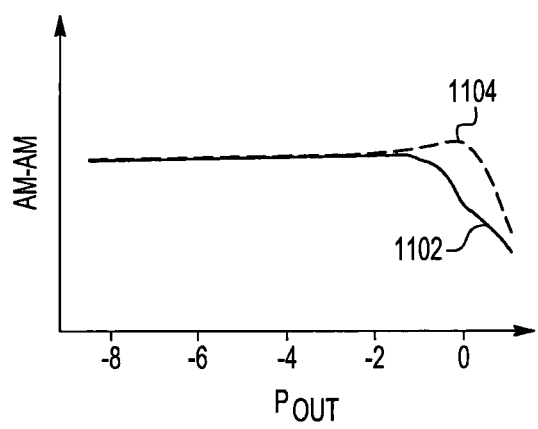
FIGS. 11A and 11B are graphs illustrating a number of am/am and am/pm distortion curves, respectively.
Figure 11B:
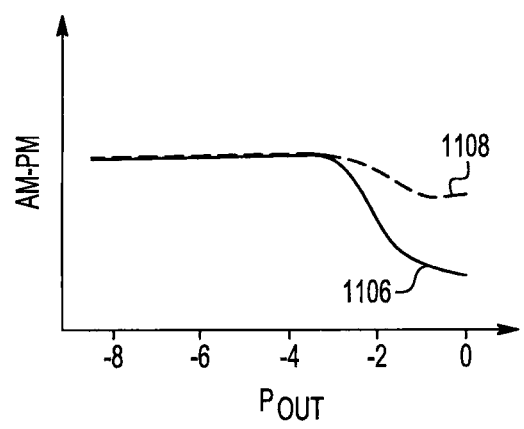

By transitioning the peaking amplifier 539 between class C and class B modes of operation (as illustrated by FIG. 9), as well as modifying the attenuation states of variable attenuators 515 and 521 (as illustrated by FIG. 10), the linearity of amplifier 500 can, in some cases, be improved. FIG. 11A is a graph illustrating a number of am/am distortion curves. The vertical axis of the graph in FIG. 11A shows am/am distortion, while the horizontal axis represents power output. Line 1102 illustrates the am/am distortion of a conventional amplifier. Line 1104 shows the am/am distortion of the present amplifier in which the class of operation of peaking amplifier 539 is modified according to FIG. 9 and the attenuation states of variable attenuators 515 and 521 are modified in according to FIG. 10. Similarly, FIG. 11B is a graph illustrating a number of am/pm distortion curves. The vertical axis of the graph in FIG. 11B shows am/pm distortion, while the horizontal axis represents power output. Line 1106 illustrates the am/pm distortion of a conventional amplifier. Line 1108 shows the am/pm distortion of the present amplifier in which the class of operation of peaking amplifier 539 is modified according to FIG. 9 and the attenuation states of variable attenuators 515 and 521 are modified in according to FIG. 10.

Various methods and systems have been described with reference to a dual-path Doherty amplifier device. These approaches, though, can be generalized to multiple-path amplifiers having three or more amplifier paths. The following, which describes the manipulation of variable attenuators and phase shifters to improve performance of a three-way Doherty amplifier, therefore, can be generalized to a multi-path amplifier having N amplifiers, and a corresponding number of input signal magnitude transition points at which each of the N amplifiers begin conducting.

Figure 12:
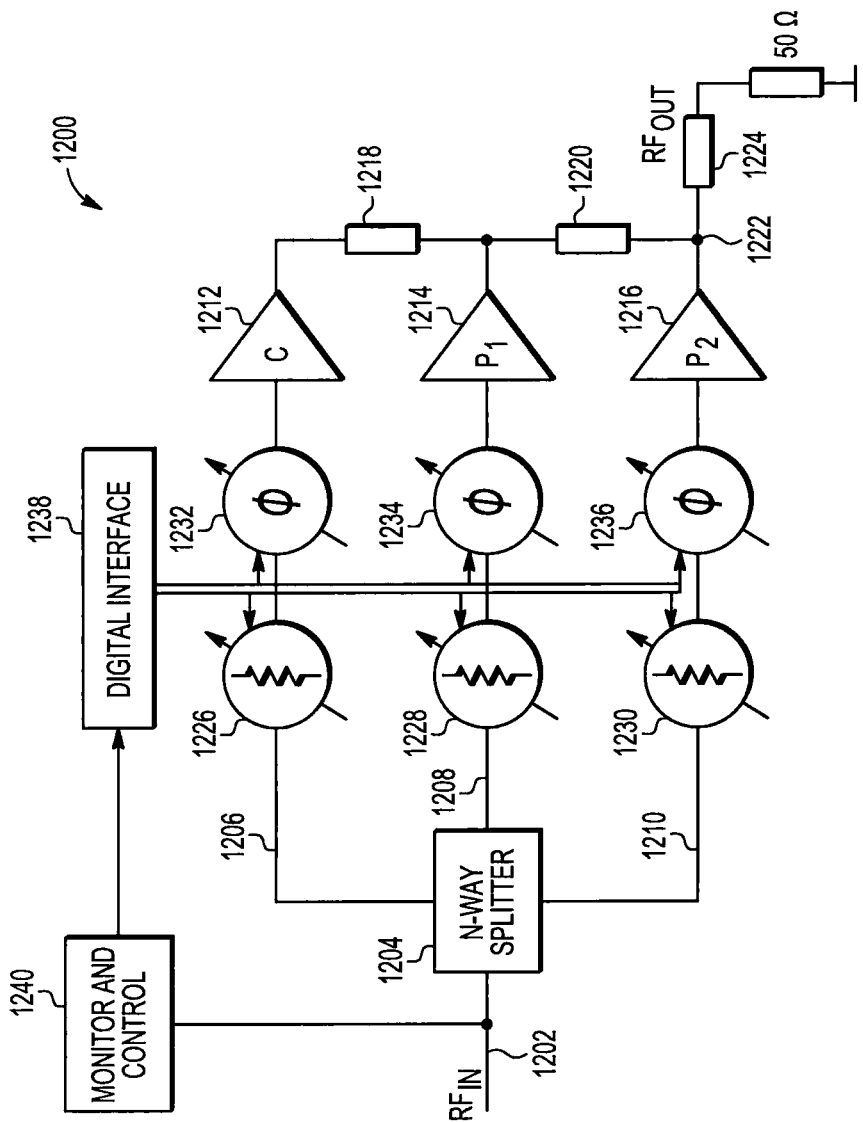
FIG. 12 is a simplified illustration of a three-way Doherty amplifier including a carrier path and two peaking paths.

FIG. 12, for example, is a simplified illustration of a three-way Doherty amplifier including a carrier path and two peaking paths. Amplifier 1200 includes an input 1202 (RFIN) connected to signal splitter 1204, which is configured to split the input signal into a number of output signals equal to the number of paths in the amplifier 1200. Amplifier 1200 includes carrier path 1206 connected to carrier amplifier 1212. A first peaking path 1208 is connected to first peaking amplifier 1214 and a second peaking path 1210 is connected to a second peaking amplifier 1216. The outputs of carrier amplifier 1212, peaking amplifier 1214, and peaking amplifier 1216 are combined by through a number of phase shift elements 1218 and 1220 at output node 1222. An impedance network, including impedance 1224 functions to present an appropriate load to each of carrier amplifier 1212, peaking amplifier 1214, and peaking amplifier 1216.

During operation, carrier amplifier 1212 is configured to amplify relatively low-level input signals. As the magnitude of the input signal increases, however, a first point is reached (transition point $\alpha 1$) at which the first peaking amplifier 1214 begins conducting. At this time it is desirable that the second and third peaking amplifiers 1216, 1218 be non-conductive. As the input signal continues to increase in magnitude, however, eventually an input power level is reached (transition point $\alpha 2$) at which the second peaking amplifier 1216 begins conducting. Transition point $\alpha 2$ represents a greater input signal magnitude than transition point $\alpha 1$. In various amplifier implementations, the value of transition points $\alpha 1$ and $\alpha 2$ can be determined by the desired load modulation of the amplifier, which is related to the power capability of the carrier and the two peaking amplifiers. Typically, transition point $\alpha 1$ is chosen as $1/(1+Pp1/Pc)$ and $\alpha 2$ as $1/(1+Pp2/(Pc+Pp1))$, where Ppc2, Pp1, and Pc are the power capability of the two peaking amplifiers and carrier amplifier, respectively. As discussed above, in a real-world devices the operation of peaking amplifiers 1214 and 1216 around transition points $\alpha 1$ and $\alpha 2$ result in inefficient and non-linear operation of amplifier 1200.

Each path in amplifier 1200 includes a variable attenuator (e.g., 1226, 1228, or 1230) and phase shifter (e.g., 1232, 1234, or 1236), enabling the attenuation and phase shift of the input signals to each of carrier amplifier 1212, peaking amplifier 1214, and peaking amplifier 1216 to be adjusted. An interface 1238 is connected to variable attenuators 1226, 1228, and 1230 to control the attenuation states thereof and phase shifters 1232, 1234, and 1236 to control the phase shifts thereof.

Figure 13A:
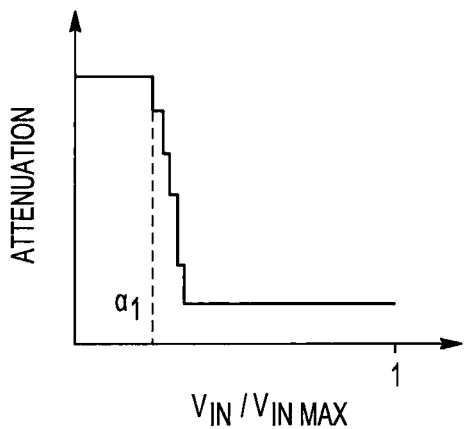
FIGS. 13A and 13B are graphs illustrating approaches for modifying an attenuation and a phase shift in a first path of a multi-path amplifier device.
Figure 13B:
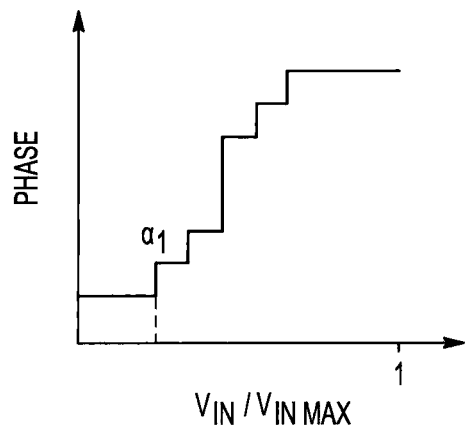
Figure 14A:
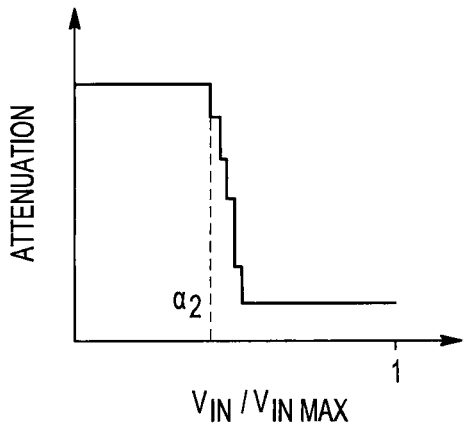
FIGS. 14A and 14B are graphs illustrating approaches for modifying an attenuation and a phase shift in a second path of a multi-path amplifier device.
Figure 14B:
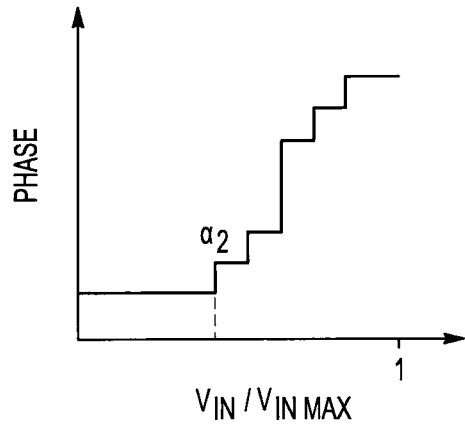
Figure 15A:
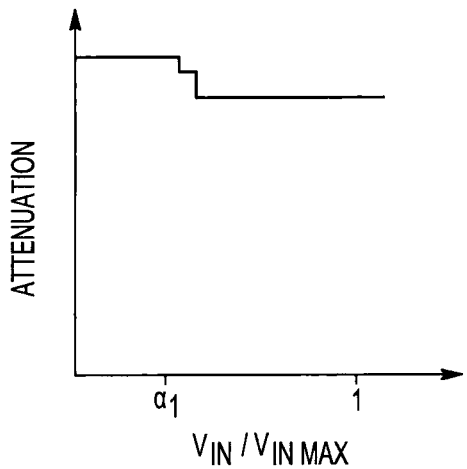
FIGS. 15A and 15B are graphs illustrating approaches for modifying an attenuation and a phase shift in a third path of a multi-path amplifier device.
Figure 15B:
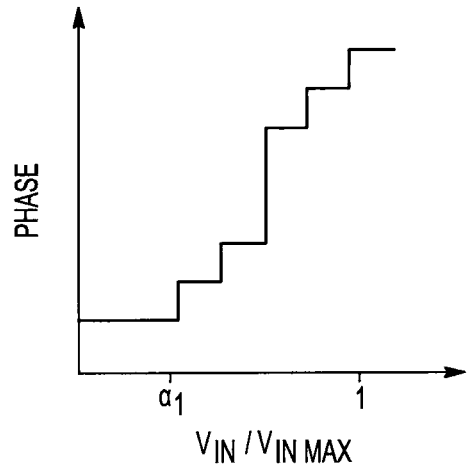

Amplifier 1200 includes controller 1240. Controller 1240 is configured to monitor input signal RFIN at input 1202. Based upon the magnitude of the input signal, controller 1240 can determine an appropriate configuration for the variable attenuators and phase shifts in each path of amplifier 1200. FIGS. 13A, 14A, and 15A are graphs showing how the attenuations of variable attenuators 1228, 1230, and 1226 (vertical axis), respectively, can be set based upon a magnitude of input signal (horizontal axis). FIGS. 13B, 14B, and 15B are graphs showing how the phase shifts of phase shifters 1234, 1236, and 1232 (vertical axis), respectively, can be set based upon a magnitude of input signal (horizontal axis).

In general, for input signal levels less than transition point $\alpha 1$, carrier amplifier 1212 is allowed to operate, while the operation of peaking amplifiers 1214 and 1216 is inhibited. As such, at input levels below transition point $\alpha 1$, the attenuation states of variable attenuators 1228 and 1230 are set to maximum values to inhibit the operation of both peaking amplifiers 1214 and 1216 (see FIGS. 13A and 14A). When the input signal magnitude exceeds transition point $\alpha 1$, but is still less than transition point $\alpha 2$, peaking amplifier 1214 is allowed to operate, but peaking amplifier 1216 is still prevented from operating. As such, at input levels greater than transition point $\alpha 1$ but less than transition point $\alpha 2$, the attenuation state of variable attenuator 1228 is set to a minimum value (see FIG. 13A), but the attenuation state of variable attenuator 1230 remains high (see FIG. 14A). When the magnitude of the input signal exceeds both transition points $\alpha 1$ and $\alpha 2$, both peaking amplifiers 1214 and 1216 are allowed to operate and the attenuation states of variable attenuators 1228 and 1230 are set to minimum values to enable the operation of both peaking amplifiers 1214 and 1216 (see FIGS. 13A and 14A).

As in the case of the dual-path amplifier described above, the transition of each of variable attenuators 1228 and 1230 between maximum and minimum attenuation states may be made over a range of input signal magnitude values. As such, when variable attenuators 1228 or 1230 transition between maximum and minimum states, the variable attenuators in fact transition through a number of intermediate attenuation values. This may be performed in a similar fashion to the attenuation state change illustrated in FIG. 6A and described above and can prevent the introduction of transient signals into the signal path of amplifier 1200 due to the attenuation states changing too quickly. In one implementation, the transition of attenuation states between maximum and minimum values may occur over a range of input signal magnitude values equal to between about 1% and about 10% of $V_{in\_max}$.

In some implementations, variable attenuator 1226 of carrier path 1206 may also be modified based upon a magnitude of the input signal to amplifier 1200. As shown in FIG. 15A, the attenuation of variable attenuator 1226 can be reduced for input signals greater than transition point $\alpha 1$.

Additionally, the phase shift of each path of amplifier 1200 may be modified to improve the linearity of amplifier 1200. Again, this may be performed for the 3-path amplifier in a similar fashion to that described above for the dual-path amplifier. As shown in FIG. 13B, when the magnitude of the input signal exceeds transition point $\alpha 1$ and peaking amplifier 1214 begins conducting, the phase shift of phase shifter 1234 can be increased to compensate for non-linearities injected into the output of amplifier 1200 due to peaking amplifier 1214 beginning to conduct. Similarly, as shown in FIG. 14B, when the magnitude of the input signal exceeds transition point $\alpha 2$ and peaking amplifier 1216 begins conducting, the phase shift of phase shifter 1236 can be increased to compensate for non-linearities injected into the output out amplifier 1200 due to peaking amplifier 1216 beginning to conduct.

In some implementations, phase shifter 1232 of carrier path 1206 may also be modified based upon a magnitude of the input signal to amplifier 1200. As shown in FIG. 15B, the phase shift of phase shifter 1232 can be adjusted for input signals greater than transition point α1.

An embodiment of a device includes an amplifier having a first path and a second path, a first variable attenuator connected to the first path, and a controller coupled to the first variable attenuator. The controller is configured to determine a magnitude of an input signal to the amplifier, when the magnitude of the input signal is below a threshold, set an attenuation of the first variable attenuator to a first attenuation value, and, when the magnitude of the input signal is above the threshold, set the attenuation of the first variable attenuator to a second attenuation value. The second attenuation value is less than the first attenuation value.

An embodiment of a system includes a Doherty amplifier having a carrier path and a peaking path. The Doherty amplifier includes a carrier amplifier configured to amplify a signal received from the carrier path and a peaking amplifier configured to amplify a signal received from the peaking path. The system includes a power splitter coupled to the carrier path and the peaking path, a first variable attenuator connected to the peaking path, and a controller coupled to the first variable attenuator. The controller is configured to determine a magnitude of an input signal to the Doherty amplifier, when the magnitude of the input signal is below a threshold, set an attenuation of the first variable attenuator to a first attenuation value, and, when the magnitude of the input signal is above the threshold, set the attenuation of the first variable attenuator to a second attenuation value. The second attenuation value is less than the first attenuation value.

An embodiment of a method includes determining a magnitude of an input signal to an amplifier. The amplifier includes a first variable attenuator connected to a first path of the amplifier. When the magnitude of the input signal is below a threshold, the method includes setting an attenuation of the first variable attenuator to a first attenuation value, and, when the magnitude of the input signal is above the threshold, the method includes setting the attenuation of the first variable attenuator to a second attenuation value. The second attenuation value is less than the first attenuation value.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
   an amplifier having a first path, a second path, a first amplifier connected to the first path, and a second amplifier connected to the second path;
   a first variable attenuator connected to the first path; and
   a controller coupled to the first variable attenuator, the controller being configured to:
   determine a magnitude of an input signal to the amplifier,
   when the magnitude of the input signal is below a threshold, wherein the threshold is equal to $1/(1+Pp/Pc)$, where Pp is a power capability of the first amplifier and Pc is a power capability of the second amplifier, set an attenuation of the first variable attenuator to a maximum attenuation value to force the first amplifier into a non-conducting condition,
   when the magnitude of the input signal is above the threshold plus an offset, wherein the offset is between 1% and 10% of a maximum input voltage of the amplifier, set the attenuation of the first variable attenuator to a minimum attenuation value to force the first amplifier into a conducting condition, and
   modify the attenuation of the first variable attenuator at a rate that is equal to or greater than an envelope rate of the input signal to the amplifier.

2. The device of claim 1, further comprising a first adjustable phase shifter connected to the first path, and wherein the controller is configured to:
   when the magnitude of the input signal is below the threshold, set a phase shift of the first adjustable phase shifter to a first phase shift value; and
   when the magnitude of the input signal is above the threshold, set the phase shift of the first adjustable phase shifter to a second phase shift value, the second phase shift value being greater than the first phase shift value.

3. The device of claim 2, further comprising a second variable attenuator connected to the second path, wherein the controller is configured to:
   when the magnitude of the input signal is below the threshold, set an attenuation of the second variable attenuator to a third attenuation value, and
   when the magnitude of the input signal is above the threshold, set the attenuation of the second variable attenuator to a fourth attenuation value, the third attenuation value being different from the fourth attenuation value.

4. The device of claim 3, further comprising a second adjustable phase shifter connected to the second path, wherein the controller is configured to:
   when the magnitude of the input signal is below the threshold, set a phase shift of the second adjustable phase shifter to a third phase shift value; and
   when the magnitude of the input signal is above the threshold, set the phase shift of the second adjustable phase shifter to a fourth phase shift value, the fourth phase shift value being greater than the third phase shift value.

5. The device of claim 1, wherein the amplifier is a Doherty amplifier and the second path is a carrier path and the second amplifier is a carrier amplifier and the first path is a peaking path and the first amplifier is a peaking amplifier.

6. The device of claim 5, wherein the controller is configured to set a gate bias of the peaking amplifier connected to the peaking path of the Doherty amplifier.

7. The device of claim 6, wherein the controller is configured to:
   when the magnitude of the input signal is below the threshold, set the gate bias to a first gate bias voltage; and
   when the magnitude of the input signal is above the threshold, set the gate bias to a second gate bias voltage, the second gate bias voltage being greater than the first gate bias voltage.

8. The device of claim 1, wherein the controller is configured to:
   when the magnitude of the input signal is between the threshold and the threshold plus the offset, set the attenuation of the first variable attenuator to a value between the maximum attenuation value and the minimum attenuation value.

9. A system, comprising:
a Doherty amplifier having a carrier path and a peaking path, the Doherty amplifier including a carrier amplifier configured to amplify a signal received from the carrier path and a peaking amplifier configured to amplify a signal received from the peaking path;
a power splitter coupled to the carrier path and the peaking path;
a first variable attenuator connected to the peaking path; and
a controller coupled to the first variable attenuator, the controller being configured to:
determine a magnitude of an input signal to the Doherty amplifier,
when the magnitude of the input signal is below a threshold, wherein the threshold is a value above which the carrier amplifier is at saturation, set an attenuation of the first variable attenuator to a first attenuation value to force the peaking amplifier into a non-conducting condition, and
when the magnitude of the input signal is above the threshold plus an offset, wherein the offset is less than about 10% of a maximum input voltage of the Doherty amplifier, set the attenuation of the first variable attenuator to a second attenuation value, the second attenuation value being less than the first attenuation value.

10. The system of claim 9, further comprising a first adjustable phase shifter connected to the peaking path, wherein the controller is configured to:
when the magnitude of the input signal is below the threshold, set a phase shift of the first adjustable phase shifter to a first phase shift value; and
when the magnitude of the input signal is above the threshold, set the phase shift of the first adjustable phase shifter to a second phase shift value, the second phase shift value being greater than the first phase shift value.

11. The system of claim 10, further comprising a second variable attenuator coupled to the carrier path, wherein the controller is configured to:
when the magnitude of the input signal is below the threshold, set an attenuation of the second variable attenuator to a third attenuation value, and
when the magnitude of the input signal is above the threshold, set the attenuation of the second variable attenuator to a fourth attenuation value, the third attenuation value being different from the fourth attenuation value.

12. The system of claim 11, further comprising a second adjustable phase shifter coupled to the carrier path, wherein the controller is configured to:
when the magnitude of the input signal is below the threshold, set a phase shift of the second adjustable phase shifter to a third phase shift value; and
when the magnitude of the input signal is above the threshold, set the phase shift of the second adjustable phase shifter to a fourth phase shift value, the fourth phase shift value being greater than the third phase shift value.

13. The system of claim 9, wherein the controller is configured to set a gate bias of the peaking amplifier.

14. The system of claim 13, wherein the controller is configured to:
when the magnitude of the input signal is below the threshold, set the gate bias to a first gate bias voltage; and
when the magnitude of the input signal is above the threshold, set the gate bias to a second gate bias voltage, the second gate bias voltage being greater than the first gate bias voltage.

15. The system of claim 9, wherein the controller is configured to:
when the magnitude of the input signal is between the threshold and the threshold plus the offset, set the attenuation of the first variable attenuator to a value between the first attenuation value and the second attenuation value.

16. A method, comprising:
determining a magnitude of an input signal to an amplifier, the amplifier including:
a first variable attenuator connected to a first path of the amplifier;
when the magnitude of the input signal is below a threshold, setting an attenuation of the first variable attenuator to a first attenuation value;
when the magnitude of the input signal is above the threshold plus an offset, wherein the offset is less than about 10% of a maximum input voltage of the amplifier, setting the attenuation of the first variable attenuator to a second attenuation value, the second attenuation value being less than the first attenuation value; and
when the magnitude of the input signal is between the threshold and the threshold plus the offset, setting the attenuation of the first variable attenuator to a value between the first attenuation value and the second attenuation value.

17. The method of claim 16, wherein the amplifier further includes a first adjustable phase shifter connected to the first path, the method further including:
when the magnitude of the input signal is below the threshold, setting a phase shift of the first adjustable phase shifter to a first phase shift value; and
when the magnitude of the input signal is above the threshold, setting the phase shift of the first adjustable phase shifter to a second phase shift value, the second phase shift value being greater than the first phase shift value.

18. The method of claim 17, wherein the amplifier further includes a second variable attenuator connected to a second path, the method further including:
when the magnitude of the input signal is below the threshold, setting an attenuation of the second variable attenuator to a third attenuation value, and
when the magnitude of the input signal is above the threshold, setting the attenuation of the second variable attenuator to a fourth attenuation value, the third attenuation value being different from the fourth attenuation value.

19. The method of claim 18, wherein the amplifier further includes a second adjustable phase shifter connected to the second path, the method further including:
when the magnitude of the input signal is below the threshold, setting a phase shift of the second adjustable phase shifter to a third phase shift value; and
when the magnitude of the input signal is above the threshold, setting the phase shift of the second adjustable phase shifter to a fourth phase shift value, the fourth phase shift value being greater than the third phase shift value.

20. The method of claim 18, wherein the amplifier is a Doherty amplifier and the first path is a peaking path including a peaking amplifier and the second path is a carrier path including a carrier amplifier and including:
when the magnitude of the input signal is below the threshold, setting a gate bias of the peaking amplifier to a first gate bias voltage; and when the magnitude of the input signal is above the threshold, setting the gate bias to a second gate bias voltage, the second gate bias voltage being greater than the first gate bias voltage.

* * * * *